United States Patent
Yazawa et al.

(10) Patent No.: US 6,720,811 B2
(45) Date of Patent: Apr. 13, 2004

(54) SEMICONDUCTOR DEVICE WITH DELAY CORRECTION FUNCTION

(75) Inventors: Minobu Yazawa, Tokyo (JP); Shinichi Nakagawa, Tokyo (JP); Yasushi Wada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/193,251

(22) Filed: Jul. 12, 2002

(65) Prior Publication Data

US 2003/0137330 A1 Jul. 24, 2003

(30) Foreign Application Priority Data

Jan. 18, 2002 (JP) ........................................ 2002-010541

(51) Int. Cl.[7] ................................................. H03L 7/00
(52) U.S. Cl. ........................ 327/161; 327/261; 375/371
(58) Field of Search ................................. 327/161–163, 327/165–166, 261, 269–271, 277, 284, 295–299; 375/371; 365/233, 233.5

(56) References Cited

U.S. PATENT DOCUMENTS

| | | | | |
|---|---|---|---|---|
| 4,796,095 A | * | 1/1989 | Shimada | ...................... 358/409 |
| 5,146,478 A | * | 9/1992 | Dragotin | ...................... 375/373 |
| 5,245,231 A | * | 9/1993 | Kocis et al. | ................. 327/277 |
| 5,534,808 A | * | 7/1996 | Takaki et al. | ................ 327/261 |

FOREIGN PATENT DOCUMENTS

| | | |
|---|---|---|
| JP | 5-100768 | 4/1993 |
| JP | 2000-91506 | 3/2000 |

* cited by examiner

*Primary Examiner*—Minh Nguyen
(74) *Attorney, Agent, or Firm*—Burns, Doane, Swecker & Mathis, LLP

(57) ABSTRACT

A semiconductor device includes a delay amount measuring unit, multiple delay sections and a correction signal generating unit. The delay amount measuring unit for measures an actual delay amount corresponding to a specified delay amount by supplying a clock signal with a known period to multiple 1-ns-delay strings with a preassigned delay amount, and by detecting phase variations of the clock signal by the 1-ns-delay strings. The delay sections includes a delay string capable of freely adjusting a connection number of its delay elements. The correction signal generating unit generates a correction signal for enabling each of the delay sections to correct the connection number of the delay strings such that each delay section has a desired delay amount, in accordance with the actual delay amount corresponding to the specified delay amount and measured by the delay measuring unit.

14 Claims, 14 Drawing Sheets

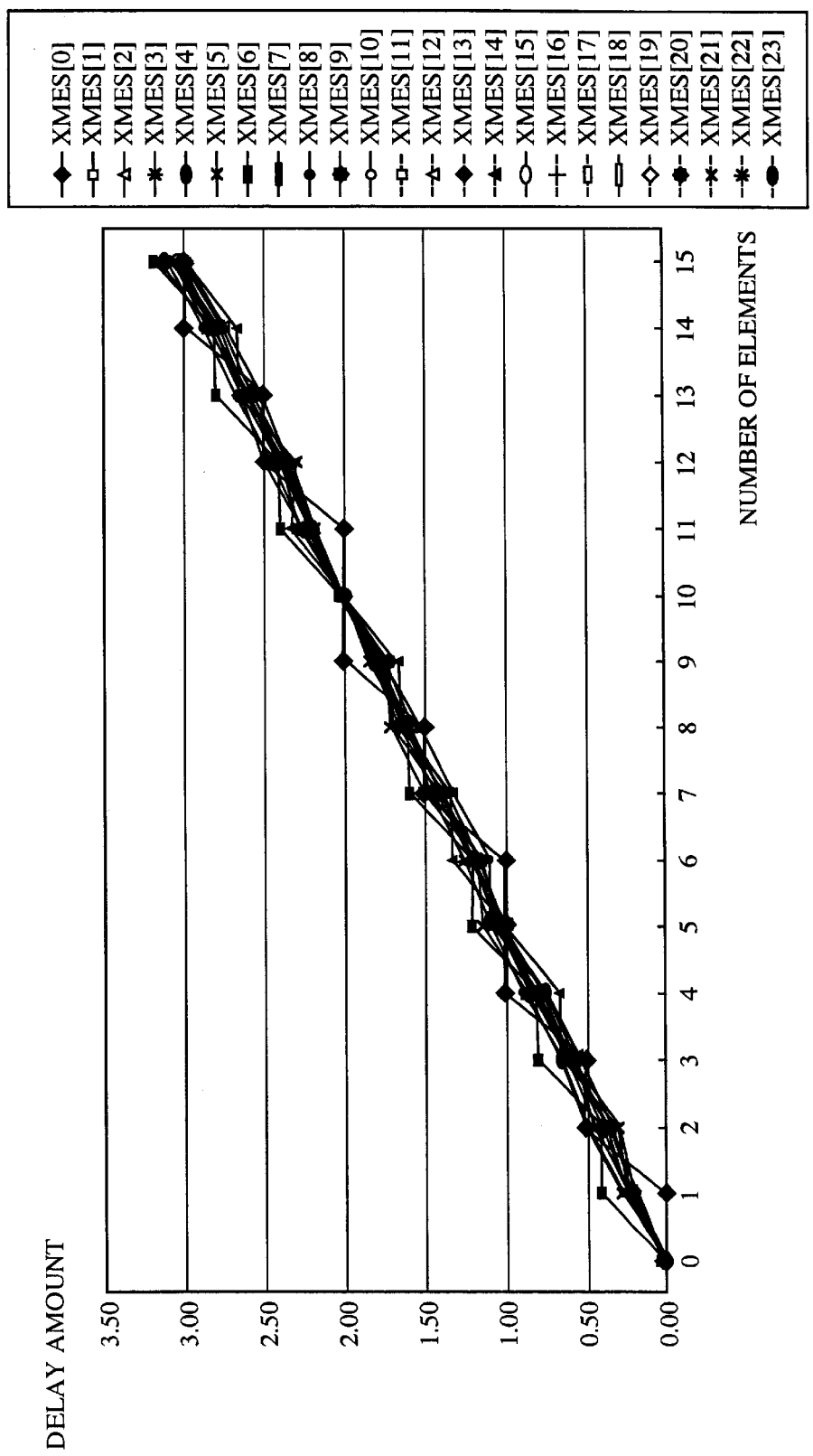

SEMICONDUCTOR DEVICE WITH DELAY CORRECTION FUNCTION

BACKGROUND OF THE INVENTION

1. Field of the Invention

The present invention relates to a semiconductor device capable of adjusting a delay amount with high accuracy.

2. Description of Related Art

FIG. 12 is a schematic diagram illustrating a problem caused by the skew of a clock signal in conventional data transmission between two or more flip-flops. FIG. 13A is a timing chart illustrating a normal case, and FIG. 13B is a timing chart illustrating the problem.

In FIG. 12, the output of a flip-flop reaches the next flip-flop with a small amount of delay. For example, 5 ns delay occurs between Q and Q1 in FIG. 12. When the clock signals CK1 and CK2 to the two flip-flops change at perfectly uniform timing as illustrated in FIG. 13A, the output Q2 of the second flip-flop changes one cycle after the output Q1 of the first flip-flop.

In contrast, when the two clock pulses CK1 and CK2 change at different timings as illustrated in FIG. 13B, such as when the clock signal CK2 delays 7 ns behind the clock signal CK1, that is, when the delay of the clock signal CK2 is greater than the delay of data of 5 ns, the output Q2 of the second flip-flop changes at nearly the same timing as the output Q1 of the first flip-flop.

In such as case, various types of malfunctions can occur with the semiconductor device. For example, a timing signal can be generated at incorrect timing, a particular bit of a data signal composed of multiple bits can change its timing, and so forth.

Thus, the skew between the clock signals supplied to the flip-flops in the same clock signal domain can cause malfunctions in data latching or timing.

To eliminate the problem, such a design is made as the skew is retained below the data delay by means of the clock tree synthesis (CTS) or mesh clock signal generation. However, the CTS for all the flip-flops in an LSI in a large system is not always advantageous because of processing power of EDA (Electronic Design Automation) tools, or variations in the accuracy of the resultant skew. Thus, they are divided into a plurality of groups to carry out the CTS or mesh clock signal generation for individual groups.

In this case, however, the skew can occur between the clock signal domain groups. To adjust the inter-group skew, delay circuits for compensating for the skew are interposed at the roots of the respective groups in order to remove the inter-group skew involved in the transfer between the flip-flops.

FIG. 14 is a schematic diagram illustrating an arrangement for removing the skew by a conventional clock driver. To compensate for the skew between a group A with 3 ns delay and a group B with 7 ns delay, which delays are obtained as a result of the CTS, the clock driver assigns 5 ns delay to the group A and 1 ns delay to the group B, so that both the groups have 8 ns delay.

With such a skew eliminating method, however, the absolute value of the delay of the semiconductor device has great effect on the normal operation of the device. For example, if the 5 ns delay and 1 ns delay inserted are both doubled in an actual device, the total delays become 5×2+3=13 ns and 1×2+7=9 ns, respectively, thereby increasing the skew between the two clock pulse domains to 4 ns. Thus, the normal transfer between flip-flops becomes impossible.

If all the delays undergo the same effect, the delays in this case will be (5+3)×2=16 ns and (1+7)×2=16 ns, providing the same delay. However, the semiconductor device has various delay factors such as wiring, inter-layer capacitance, delay due to drain current Ids of transistors and so on. Accordingly, not all the delays are subjected to the same effect. As a result, a particular delay factor can bring about the skew.

FIG. 15 is a circuit diagram showing a configuration of a conventional nonoverlapping two-phase clock signal generating circuit, and FIG. 16 is a timing chart illustrating conventional nonoverlapping two-phase clock signals.

To adjust the delay amount precisely in the conventional semiconductor device, the nonoverlapping two-phase clock signal generating circuit as shown in FIGS. 15 and 16 is available, for example.

The two-phase clock signals are said to be nonoverlapping because they are never both in the high state at the same time. To utilize both the rising edge and falling edge of the two-phase clock signals, the width of the high state is sometimes controlled intentionally. In FIGS. 15 and 16, the high width of the clock signals are reduced to 5 ns using the inverter delays.

However, only connecting the inverters in series to utilize the delay of transistors can bring about unexpected delay when the difference increases between the delay based on the circuit simulation and the delay of actual device, thereby causing malfunctions.

For example, it is very difficult for the delays connected in series to implement the clock signal width of 5–7 ns with the nonoverlapping width of 1 ns. This is because the delays connected in series are subjected to the manufacturing variations of the semiconductor device, and hence they can hardly carry out the highly accurate control of the width of the clock signal.

Furthermore, it is often necessary for the semiconductor device to generate clock signals with their phase aligned in a system that includes a first clock signal and a second clock signal with different phases, the first clock signal having a specified period and the second clock signal having the period identical to or integer multiple of the period of the first clock signal.

However, it is not easy to generate the clock signals with their phased synchronized.

With the foregoing configuration, the conventional semiconductor device cannot adequately remove the delay error caused by the manufacturing variations of the semiconductor device by the method as shown in FIG. 14 that tries to eliminate the skew using the clock driver. Thus, it has a problem of impairing the normal operation.

In addition, the nonoverlapping two-phase clock signal generating circuit as shown in FIG. 15 has a problem of causing the delay error due to the manufacturing variations in the semiconductor device, thereby hindering the normal operation.

Furthermore, it is difficult for the system, which includes the first clock signal with the specified period, and the second clock signal with the period identical to or integer multiple of the period of the primary clock signal and with different phases, to generate the clock signals with aligned phases.

SUMMARY OF THE INVENTION

The present invention is implemented to solve the foregoing problems. It is therefore an object of the present invention to provide a semiconductor device capable of eliminating the delay error caused by the manufacturing variations, thereby correcting the delay to a desired delay amount.

Another object of the present invention is to provide a semiconductor device capable of generating a clock signal with a period identical to or integer multiple of the period of an input clock signal, and with its phase aligned to the input clock signal.

According to a first aspect of the present invention, there is provided a semiconductor device comprising: delay amount measuring means for measuring an actual delay amount corresponding to a specified delay amount by supplying a clock signal with a known period to a plurality of delay strings, each of which has a delay amount determined in advance; a plurality of delay sections each including a delay string capable of freely adjusting a connection number of its delay elements; and correction signal generating means for generating a correction signal for enabling each of the delay sections to correct the connection number of the delay strings such that each delay section has a desired delay amount in accordance with the actual delay amount. Thus, it offers an advantage that the delay measuring means can detect the delay error due to the manufacturing variations of the semiconductor device after the fabrication, and that the correction signal generating means can correct the plurality of delay sections such that they each have a desired delay amount.

According to a second aspect of the present invention, there is provided a semiconductor device, in which the foregoing semiconductor device is used as a feedback delay strings of a nonoverlapping two-phase clock signal generating circuit. Thus, it offers an advantage that the delay measuring means can detect the delay error due to the manufacturing variations of the semiconductor device after the fabrication, and that the correction signal generating means can correct the plurality of delay sections such that they each have a desired delay amount. In addition, it offers an advantage of being able to achieve the precise setting of the nonoverlapping width free from the effect of the manufacturing variations in the semiconductor device.

According to a third aspect of the present invention, there is provided a semiconductor device, in which the foregoing semiconductor device is applied to an inter-two-clock phase adjusting circuit. Thus, it offers an advantage of being able to select and output the clock signal which has the same phase as the input clock signal, and the period of which is equal to or integer multiple of that of the input clock signal.

BRIEF DESCRIPTION OF THE DRAWINGS

FIG. 5A is a schematic diagram illustrating a lookup table used as a correction signal generating section of the embodiment 1 in accordance with the present invention;

FIG. 5B is a schematic diagram illustrating theoretical delay amounts for respective numbers of elements based on the lookup table;

FIG. 6 is a graph illustrating characteristics of the theoretical delay amounts for various numbers of elements;

FIG. 7A is a schematic diagram illustrating a lookup table used as a correction signal generating section of an embodiment 2 in accordance with the present invention;

FIG. 7B is a schematic diagram illustrating a theoretical delay amounts for various numbers of elements based on the lookup table;

DETAILED DESCRIPTION OF THE PREFERRED EMBODIMENTS

The invention will now be described with reference to the accompanying drawings.

Embodiment 1

Figure 1:
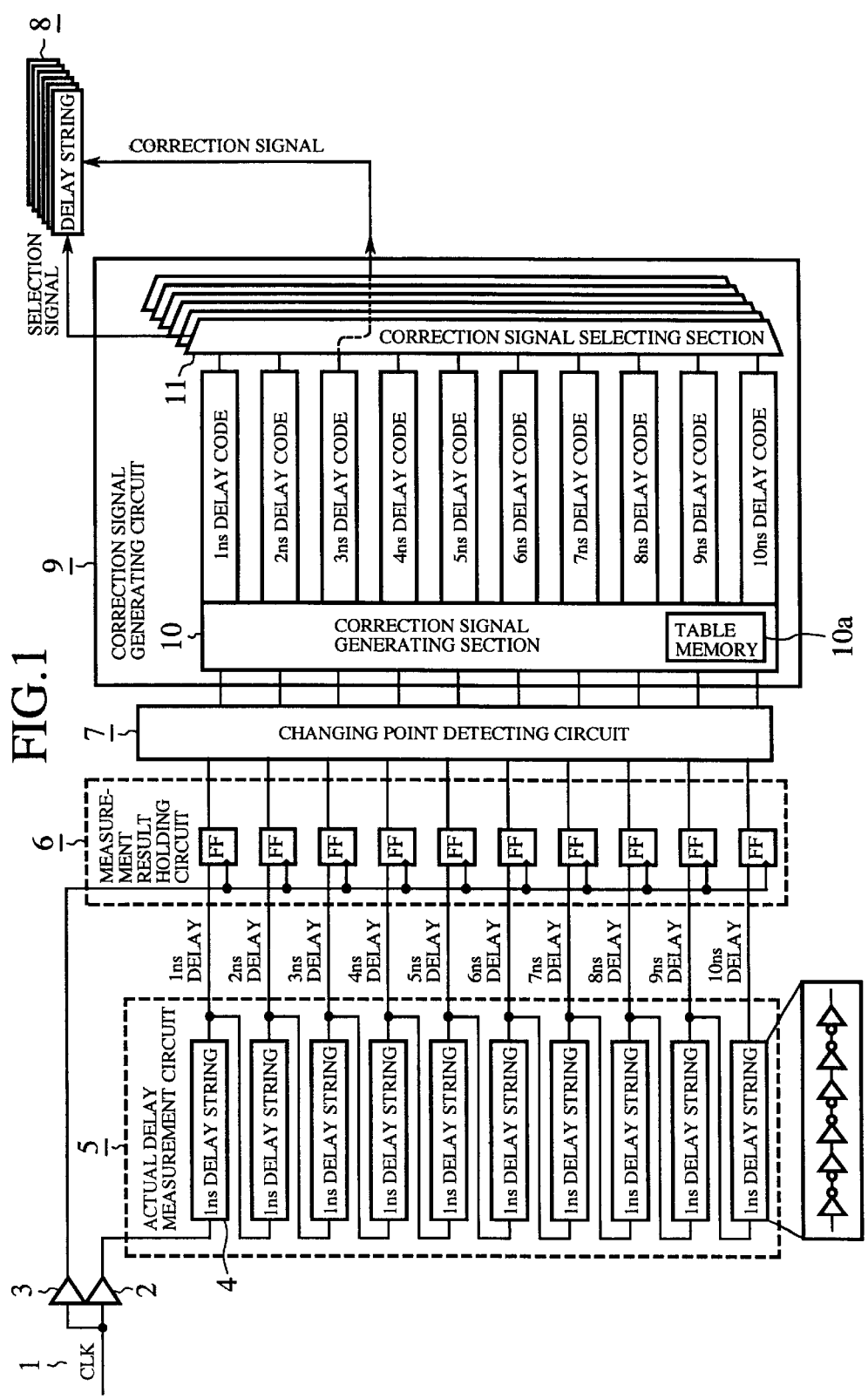
FIG. 1 is a block diagram showing a configuration of a delay amount adjusting circuit of an embodiment 1 in accordance with the present invention.

FIG. 1 is a block diagram showing a configuration of a delay amount adjusting circuit of an embodiment 1 in accordance with the present invention. In FIG. 1, the reference numeral 1 designates a fixed period clock signal CLK; and reference numerals 2 and 3 each designates a buffer cell to which the clock signal CLK 1 is supplied.

The reference numeral 4 designates a 1-ns-delay string (delay string) designed such that it has a specified delay amount of 1 ns by adjusting the number of elements of its inverter chain. The reference numeral 5 designates an actual delay measurement circuit (actual delay measurement section) that is composed of a plurality of 1-ns-delay strings 4 connected in series, and is supplied with the clock signal CLK 1 via the buffer cell 2 to vary the phase of the clock signal CLK 1 by the 1-ns-delay strings 4.

The reference numeral 6 designates a measurement result holding circuit (measurement result holding means) consisting of a plurality of flip-flops having one-to-one correspondence with the 1-ns-delay strings 4. It samples the clock signal as the data, the phase of which is shifted through the individual 1-ns-delay strings 4, at the timing of the clock signal CLK 1 supplied through the buffer cell 3, and holds the measurement results.

The reference numeral 7 designates a changing point detecting circuit (changing point detecting means) for loading the outputs of the individual flip-flops of the measurement result holding circuit 6, and for detecting a changing point at which the measurement results vary from "0" to "1" beginning from the measurement results with the smallest delay. Here, the actual delay measurement circuit 5, measurement result holding circuit 6, and changing point detecting circuit 7 constitute a delay amount measuring means for measuring the actual delay amount corresponding to the specified delay amount.

Figure 14:
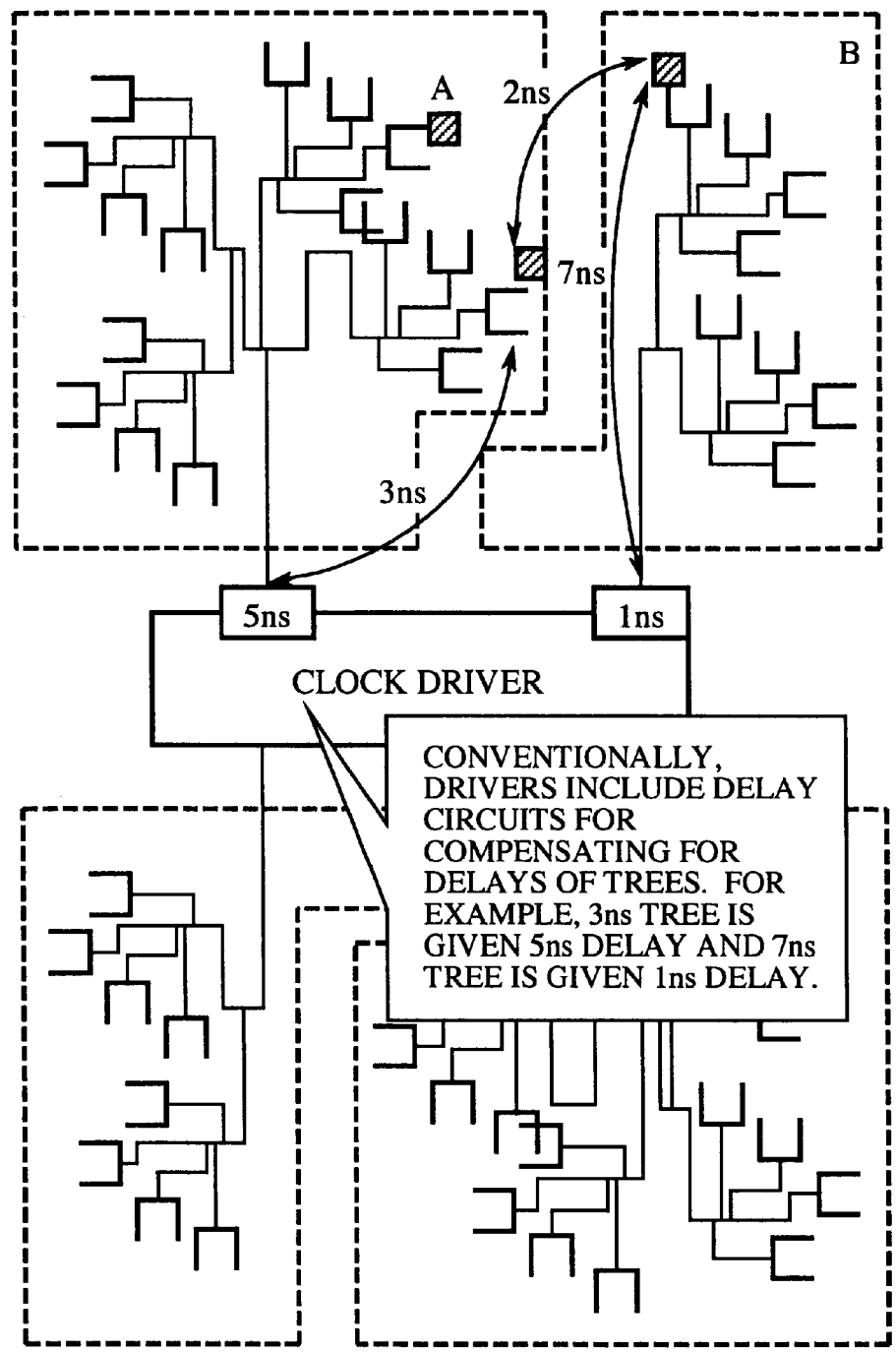
FIG. 14 is a schematic diagram illustrating an arrangement for removing the skew by a conventional clock driver.
Figure 15:
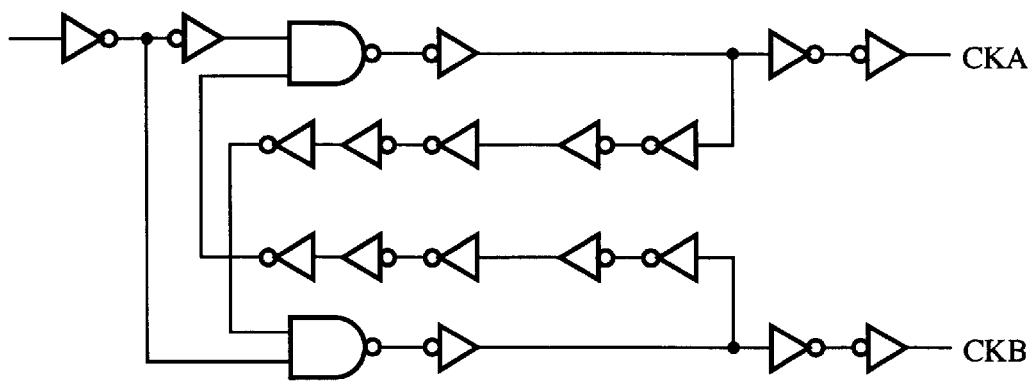
FIG. 15 is a circuit diagram showing a configuration of a conventional nonoverlapping two-phase clock signal generating circuit.
Figure 16:
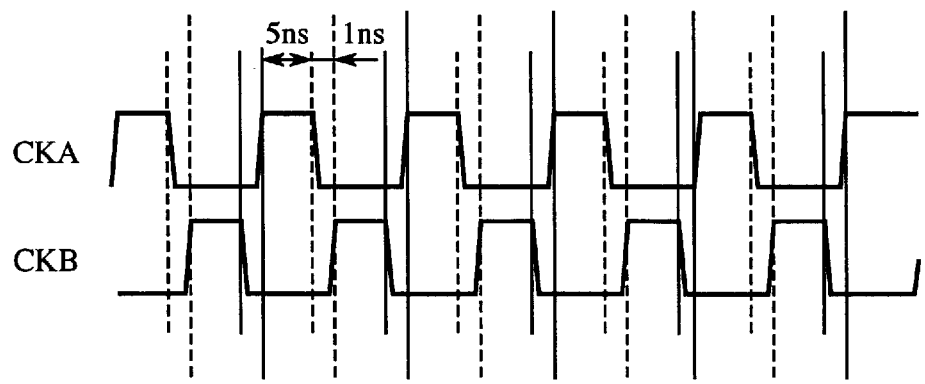
FIG. 16 is a timing chart illustrating a conventional nonoverlapping two-phase clock signals.

The reference numeral 8 designates a plurality of delay strings, each of which includes a variable number of delay elements connected in series. In the present embodiment 1, they correspond to a plurality of delay strings inserted into the roots of the individual clock signal trees as shown in FIG. 14 in connection with the conventional technique.

The reference numeral 9 designates a correction signal generating circuit (correction signal generating means) for generating a correction signal for correcting the connection number of the delay strings 8 such that they each have a desired delay amount in response to the changing point detected by the changing point detecting circuit 7, that is, in accordance with the actual delay amount corresponding to the specified delay amount theoretically. The correction signal generating circuit 9 includes a correction signal generating section 10 and correction signal selecting sections 11. The correction signal generating section 10 generates a correction signal (the connection number) corresponding to the desired delay amounts (0.2 ns intervals in the range of 0–3 ns) of the individual delay strings 8 in response to the changing point detected by the changing point detecting circuit 7. The correction signal selecting sections 11 are associated with the delay strings 8, supply the individual delay strings 8 with a selection signal, followed by supplying the selected delay string 8 with the correction signal.

Figure 2:
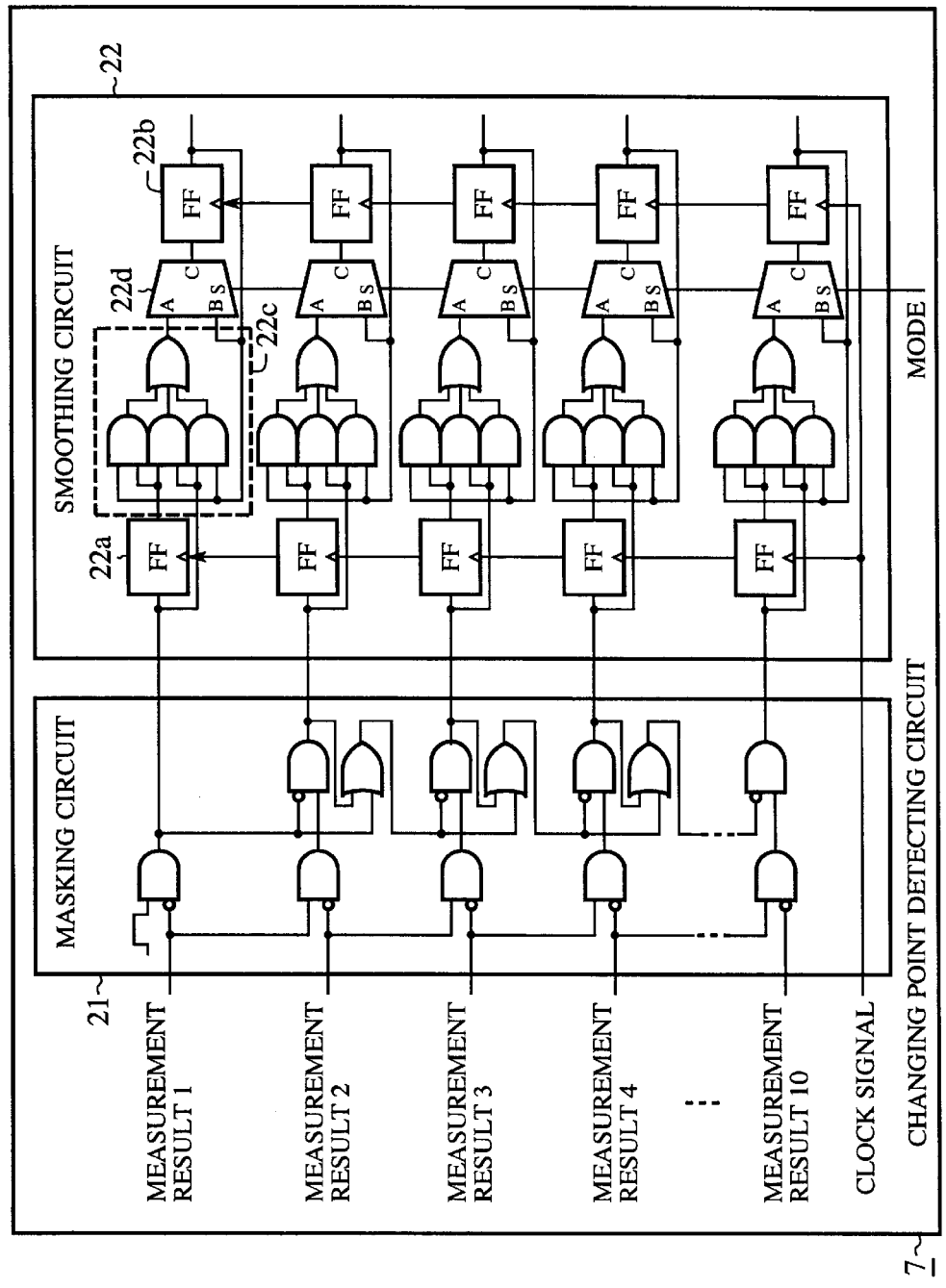
FIG. 2 is a circuit diagram showing the details of a changing point detecting circuit.

FIG. 2 is a circuit diagram showing the details of the changing point detecting circuit. In FIG. 2, the reference numeral 21 designates a masking circuit (masking means) composed of NAND circuits and OR circuits. The masking circuit 21 masks all the changing points except for the first changing point, at which the measurement results held by the measurement result holding circuit 6 change for the first time beginning from the smallest delay among the measurement results.

The reference numeral 22 designates a smoothing circuit (smoothing means) for detecting the changing point by taking account of the currently detected changing point and the previously detected changing points. The smoothing circuit 22 includes flip-flops 22a for holding immediately preceding outputs of the masking circuit 21; flip-flops 22b for holding majority decision results; majority logic circuits 22c for making a majority decision of the current outputs of the masking circuit 21, the outputs of the flip-flops 22a holding the immediately preceding outputs of the masking circuit 21, and the outputs of the flip-flops 22b holding the majority decision results; and selectors (changing point fixing means) 22d for fixing the outputs of the flip-flops 22b in response to an additional MODE signal outside or inside a register.

Figure 3A:
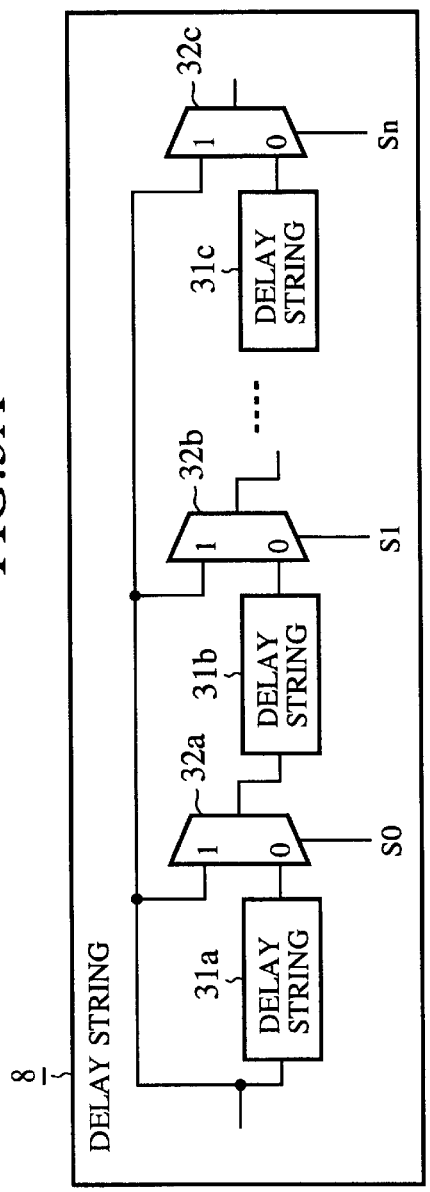
FIGS. 3A and 3B are circuit diagrams each showing the details of a delay string.
Figure 3B:
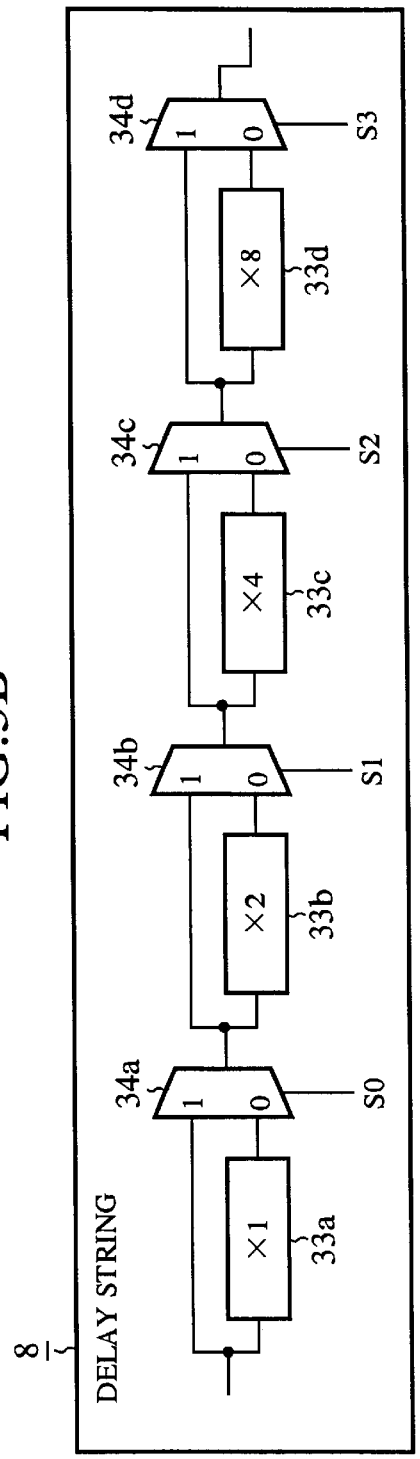

FIGS. 3A and 3B each show a circuit diagram showing the details of the delay string 8: FIG. 3A shows a configuration including a plurality of delay strings, each of which has the same specified delay amount; and FIG. 3B shows a configuration including a plurality of delay strings which have the specified delay amounts of a power of two.

In FIG. 3A, reference numerals 31a–31c designate a plurality of delay strings, each of which has the same specified delay amount, and is composed of an inverter chain, for example. Reference numerals 32a–32c designate selectors (delay string connecting means) which are connected between the individual delay strings 31a–31c to decide as to whether to connect the individual delay strings 31a–31c or not in response to the correction signals.

In FIG. 3B, reference numerals 33a–33d designate a plurality of delay strings, the specified delay amounts of which increase by the power of two as they progress from a smaller to a lager value. Reference numerals 34a–34d designate selectors (delay string connecting means) which are connected between the individual delay strings 33a–33d to decide as to whether to connect the individual delay strings 33a–33d or not in response to the correction signals.

FIG. 4 is a schematic diagram illustrating the principle of the delay amount measuring means.

Figures 5A, 5B:
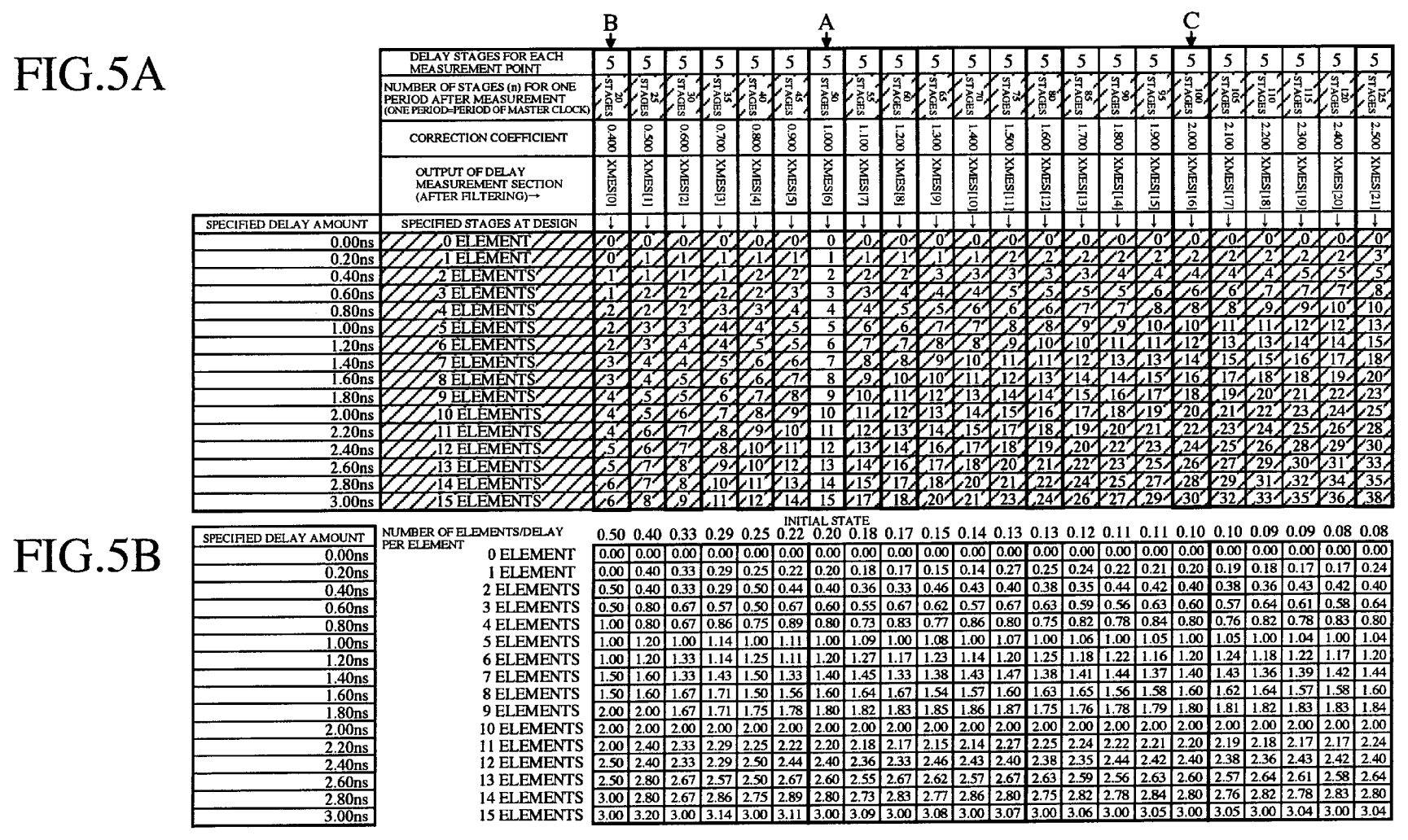

FIG. 5A is a schematic diagram illustrating a lookup table used as the correction signal generating section of the embodiment 1 in accordance with the present invention; FIG. 5B is a schematic diagram illustrating theoretical delay amounts for various numbers of elements based on the lookup table; and FIG. 6 is a graph illustrating characteristics of the theoretical delay amounts for various numbers of elements.

Next, the operation of the present embodiment 1 will be described.

The present embodiment 1 is applicable, for example, to a semiconductor device that eliminates the delay error caused by the manufacturing variations of the semiconductor device in the conventional technique that removes the skew using the clock driver as shown in FIG. 14, thereby implementing the desired delay amount by correction. As a precondition of the application, it is preferable that the ratio of the actual delay amounts (actual delay amounts caused by the manufacturing variations) to the specified delay amounts (delay amounts specified by its designer) of the actual delay measurement circuit 5 and delay strings 8 be approximately constant. For example, the transistors constituting the individual delay strings may consist of a replica circuit with nearly the same characteristics by fabricating them at the same size and in the same layout.

In FIG. 1, receiving the clock signal CLK 1, the buffer cell 2 supplies it to the actual delay measurement circuit 5, and the buffer cell 3 supplies it to the measurement result holding circuit 6 as a sampling clock signal.

As for the clock signal supplied to the measurement result holding circuit 6, it may be a clock signal with the same period as the clock signal CLK 1, or a clock signal with a period of an integer multiple of the clock signal CLK 1, in addition to the clock signal CLK 1.

In the actual delay measurement circuit 5, the 1-ns-delay strings 4, each of which is designed to have the specified delay amount of 1 ns, delay the clock signal CLK 1 successively, and output the clock signals CLK 1 with their phases being varied.

In the measurement result holding circuit 6, the plurality of flip-flops corresponding to the individual 1-ns-delay strings 4 sample the clock signals with their phases varied via the individual 1-ns-delay strings 4 by the rising edge of the clock signal CLK 1 via the buffer cell 3, and hold the measurement results "0" or "1".

Figure 4A:
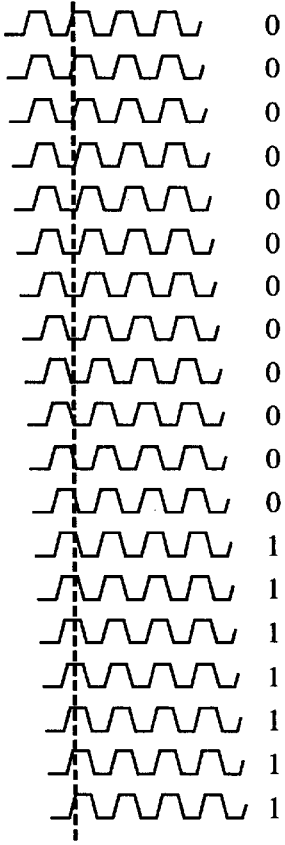
FIG. 4 is a schematic diagram illustrating a theory of a delay amount measuring means.
Figure 4B:
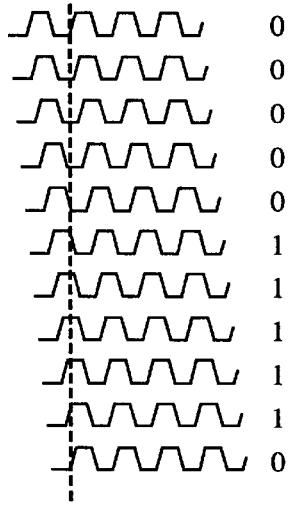
Figure 4C:
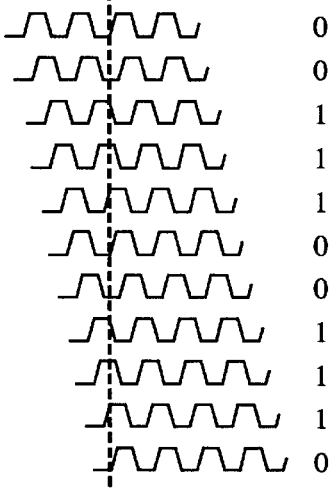

FIGS. 4A–4B are schematic diagrams illustrating the principle of the delay amount measuring means. It is assumed here that the period of the clock signal CLK 1 is 10 ns, and the specified delay amount of the individual delay string is 1 ns. FIGS. 4A–4C designate the individual strings when the actual delay amount is 0.5 ns, 1 ns and 2 ns, respectively.

The individual 1-ns-delay strings 4 delay the clock signal CLK 1, thereby providing the waveforms as illustrated in FIGS. 4A–4C because of the manufacturing variations of the semiconductor device. The measurement result holding circuit 6 samples the waveforms at the timing of the rising edge of the clock signal CLK 1 passing through the buffer cell 3, which is indicated in these figures by bold broken lines. Thus, the actual delay amounts can be obtained as the measurement results for the specified delay amount as shown by "0" and "1" in FIGS. 4A–4C.

For example, the changing point from "0" to "1" appears at 13th stage in FIG. 4A, sixth stage in FIG. 4B and third stage in FIG. 4C.

Next, receiving the outputs of the individual flip-flops of the measurement result holding circuit 6, the changing point detecting circuit 7 detects the changing point at which the measurement result changes from "0" to "1" for the first time beginning from the smallest delay.

In the actual circuit, however, the individual flip-flops of the measurement result holding circuit 6 may have two or more changing points from "0" to "1". For example they may output "00101". In view of this, the changing point detecting circuit 7 includes a masking circuit 21 as shown in FIG. 2 to mask the changing points other than the first changing point among the measurement results held by the measurement result holding circuit 6. Thus, it outputs a one-shot signal corresponding to the first changing point (a signal different only at that point), thereby enhancing the stability of the operation of the changing point detecting circuit 7.

In addition, when the sampling timing of the clock signal of the flip-flops of the measurement result holding circuit 6 is close to the data changing timing, the output of the measurement result holding circuit 6 may vary from time to time because of the fluctuations of the characteristics of the semiconductor device, inter-layer capacitance of adjacent signals, etc. For example, it may be "00011" or "00111" depending on the timing. In view of this, the smoothing circuit 22 includes the majority logic circuit 22c for making the majority decision of the current output of the masking circuit 21, the output of the flip-flops 22a holding the immediately preceding output of the masking circuit 21, and the output of the flip-flops 22b holding the majority decision result to smooth the variations in the changing points of the individual detection, thereby bringing the detection result to a more averaged result.

Furthermore, since the clock signal is an important signal associated with the basic operation of the semiconductor device, dynamic changes of the signal in accordance with the measurement results will bring about a malfunction. Thus, before starting the major operation of the actual semiconductor device, it is supplied with an external MODE signal to switch the selection of each selector 22d from A to B, in which A is connected to the output of one of the majority logic circuits 22c, and B is connected to the output of one of the flip-flops 22b holding the majority decision result, thereby fixing the changing point and maintaining the correction state of the delay string 8.

Next, the correction signal generating section 10 of the correction signal generating circuit 9 generates the correction signal associated with the desired delay amount of the individual delay strings 8 in response to the changing point detected by the changing point detecting circuit 7.

Theoretically, the actual delay amount per stage of the 1-ns-delay string 4 of the actual delay measurement circuit 5 is calculated from the changing point of the changing point detecting circuit 7. For example, when the period of the clock signal CLK 1 is 10 ns, and the changing point from "0" to "1" takes place at the sixth stage, the actual delay amount is 1.0 ns/stage, that is, the actual delay amount is equal to the specified delay amount as designed. If the changing point occurs at the 13th stage, the actual delay amount is 0.5 ns/stage, in which case it must be doubled to obtain the specified delay amount. Furthermore, if the changing point occurs at the third step, the actual delay amount is 2.0 ns/stage, in which case it must be halved to obtain the specified delay amount.

As a result, the delay amount of the delay string 8 after the correction (referred to as correction amount from now on) needed to achieve the desired delay amount by the delay string 8 is given by the following expression.

(correction amount)=(desired delay amount of delay string 8)×(specified delay amount of actual delay measurement circuit 5)/(actual delay amount of actual delay measurement circuit 5)

For example, when the actual delay amount of the 1-ns-delay string 4 is 2.0 ns/stage, and the desired delay amount of the delay string 8 is 3 ns, the desired delay amount can be achieved by half the number of the delay elements that is specified at the design, and the correction amount is given by the following expression:

(correction amount)=3 ns×1 ns/2.0 ns=1.5

When one of the delay strings 8 has 15 stages and its desired delay amount is 3 ns, and the calculated correction amount is 1.5 ns, for example, the correction signal generating section 10 recognizes that the desired delay amount is obtained by half the 15 stages. Thus, the closest integer eight is adopted, and the correction signal corresponding to it is produced. In this case, since the desired delay amount of the delay string 8 is 3 ns, the correction signal generating section 10 outputs the correction signal as a 3-ns-delay code.

Receiving the 3-ns-delay code as the correction signal from the correction signal generating section 10, the correction signal selecting section 11 outputs a selection signal to select one or more delay strings 8 with the desired delay amount of 3 ns from a plurality of delay strings 8, and outputs the correction signal corresponding to the eight-stage connection of the delay strings 8 selected.

In this way, the correction signal generating circuit 9 outputs the selection signal corresponding to the desired delay amount of the delay strings 8, and the correction signal associated with it.

FIG. 3A shows an example of the delay strings 8 including delay strings, each having the specified delay amount evenly. It switches the selectors 32a–32c in response to the correction signals S0-Sn, so that the number of elements becomes eight by connecting the delay strings 31a–31c, for example. The delay string 8 can increase the specified delay amount by every fixed step in response to the correction signal.

On the other hand, FIG. 3B shows an example of the delay string 8 including delay strings, each having the specified delay amount in accordance with the power of two. It switches the selectors 34a–34d in response to the correction signals S0-S3, so that the number of elements becomes eight by connecting the delay strings 33a–33d, for example. The delay string 8 can reduce the number of selectors.

As described above, the present embodiment 1 can detect the delay error caused by the manufacturing variations in the semiconductor device after it is produced, and correct the plurality of delay strings 8 such that each of them has the desired delay amount.

Incidentally, the correction signal generating section 10 must carry out division to calculate the correction amount.

A divider consisting of semiconductor devices has a large circuit scale and requires a few clock steps for a single operation.

In view of this, the correction signal generating section 10 can be configured using a lookup table as shown in FIG. 5A. Such a lookup table is stored in advance in a table memory 10a of the correction signal generating section 10.

The lookup table as shown in FIG. 5A is based on the assumption that the period of the clock signal CLK 1 is 10 ns, the 1-ns-delay strings 4 of the actual delay measurement circuit 5 each include five transistor elements each having 0.2 ns delay, and the delay strings 8 each include 15 transistor elements each having 0.2 ns delay, thereby being able to correct the specified delay amount in the range of 0 ns–3 ns.

The arrow A indicates the case where the number of stages of the transistor elements corresponding to one cycle of the clock signal (10 ns), which is obtained from the changing point detected by the changing point detecting circuit 7, is 50. In this case, the delay per transistor element of the 1-ns-delay string 4 is 0.2 ns (=10 ns/50). Thus, each 1-ns-delay string 4 provides 1 ns delay, which means that it has the delay just as designed, giving the correction coefficient of 1.00, and making the correction unnecessary. In this case, since the designed number of stages of the transistor elements can be used without change, the desired delay amounts of the delay strings 8 are achievable by setting 0–15 stages in accordance with the specified delay amount. For example, 2 stages are set for the specified delay amount of 0.4 ns, and 14 stages for the specified delay amount of 2.8 ns.

The arrow B indicates the case where the number of stages of the transistor elements corresponding to one cycle of the clock signal (10 ns), which is obtained from the changing point detected by the changing point detecting circuit 7, is 20. In this case, the delay per transistor element of the 1-ns-delay string 4 is 0.5 ns (=10 ns/20). Thus, the 1-ns-delay strings 4 each provide 2.5 ns delay. Accordingly, to achieve the desired delay amounts of the delay strings 8, 0–6 stages (=15 stages/2.5) are set in accordance with the specified delay amounts. For example, one stage (0.5 ns) is set for the specified delay amount of 0.4 ns, and six stages (3 ns) are set for the specified delay amount of 2.8 ns. Although errors such as 0.4 ns–0.5 ns and 2.8 ns–3 ns occur between the specified delay amounts and the actual delay amounts, they cannot be adjusted more accurately because the delay per transistor element is 0.5 ns. Such a level of errors may be acceptable for adjusting the clock signal skew to which the present embodiment 1 is applied.

The arrow C indicates the case where the number of stages of the transistor elements corresponding to one cycle of the clock signal (10 ns), which is obtained from the changing point detected by the changing point detecting circuit 7, is 100. In this case, the delay per transistor element of the 1-ns-delay strings 4 is 0.1 ns (=10 ns/100), and the 1-ns-delay strings 4 each provide 0.5 ns delay. Accordingly, to achieve the desired delay amounts of the delay strings 8, 0–30 stages (15 stages×2.0) are set in accordance with the specified delay amounts. For example, four stages (0.4 ns) are set for the specified delay amount of 0.4 ns, and 28 stages (2.8 ns) are set for the specified delay amount of 2.8 ns.

As described above, the lookup table of FIG. 5A can generate different correction signals almost simultaneously with simple configuration without division.

FIG. 5B shows the theoretical delay amounts for various numbers of elements according to the lookup table, and FIG. 6 is a graph illustrating them.

Embodiment 2

Figures 7A, 7B:
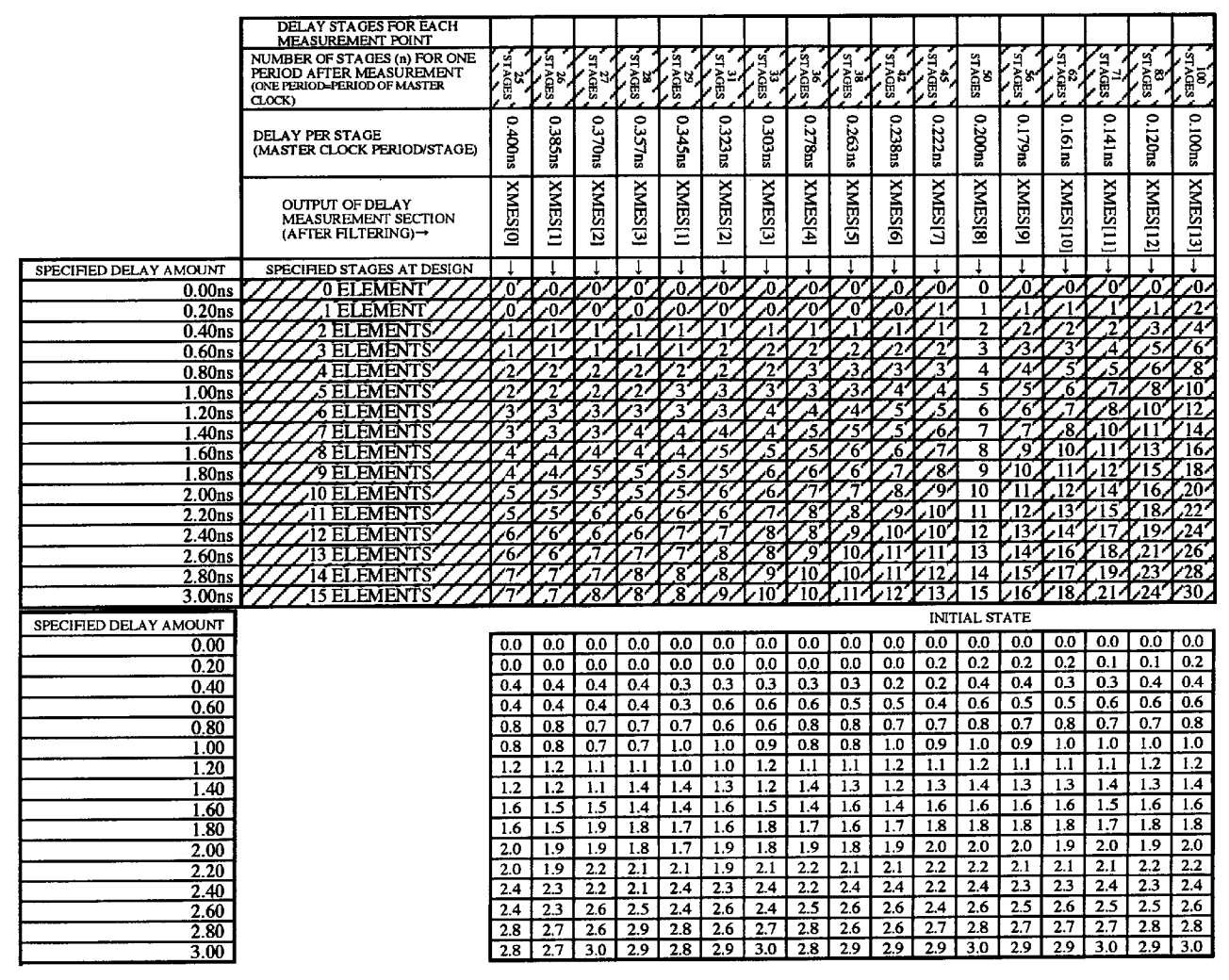
Figure 8:
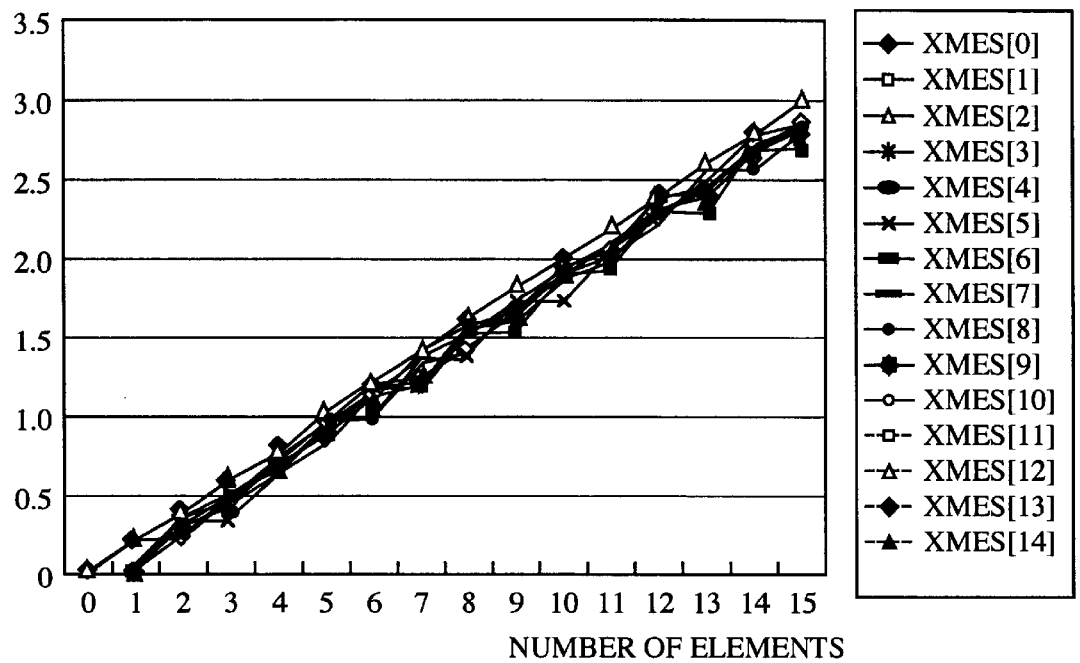
FIG. 8 is a graph illustrating characteristics of the theoretical delay amount per various numbers of elements.
Figure 12:
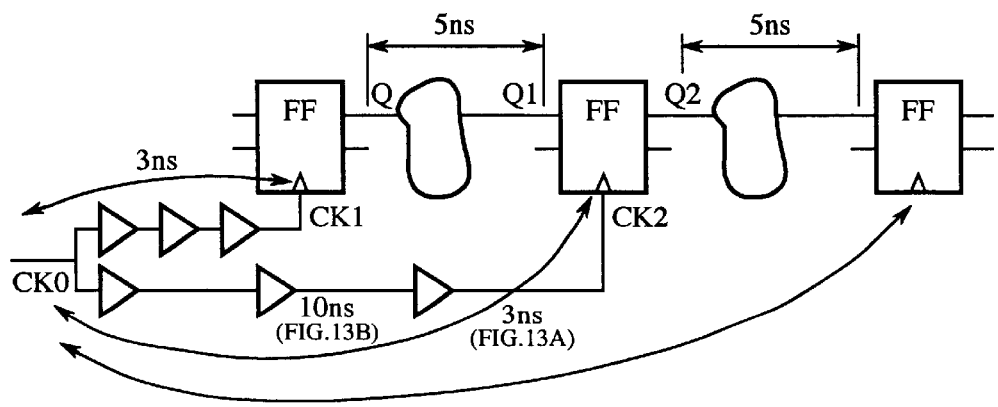
FIG. 12 is a schematic diagram illustrating a problem caused by the skew of a clock signal in conventional data transmission between two or flip-flops.

FIG. 7A is a schematic diagram illustrating a lookup table used as the correction signal generating section 9 of an embodiment 2 in accordance with the present invention; FIG. 7B is a schematic diagram illustrating theoretical delay amounts per various number of elements based on the lookup table; and FIG. 8 is a graph illustrating characteristics of the theoretical delay amounts per various number of elements;

As for the lookup table as shown in FIG. 5A of the foregoing embodiment 1, the delay of each transistor element is 0.2 ns, and the transistor elements are divided into 22 groups in accordance with their total number ranging from 20 to 125, at every five stage interval to generate the correction signal for 0 ns–3 ns. The table shows the number of stages of the transistor elements of each delay string 8 determined at the design, and the number of transistor elements actually required. In the method of FIG. 5A, which samples the clock signal at every fixed interval of the transistor elements, an increment per stage is small when the number of the transistor elements is large, and is large when the number of the transistor elements is small. This means that when the semiconductor device operates at high speed (in the direction the number of the delay stages increases), redundant delay stages are present, whereas when it operates at low speed, more fine adjustment is likely to become necessary.

In view of this, the actual delay measurement circuit 5 of the embodiment 2 is configured such that the specified delay amount is made small such as 0.2 ns in a region where the delay is small, whereas it is made large such as 3.4 ns in a region where the delay is large, thereby forming the delay strings by connecting the transistor elements in series by the number corresponding to these values. With the configuration, it is possible for a smaller number of delay strings to achieve a wider range of delay adjustment.

In accordance with this, the lookup table of the second embodiment 2 as shown in FIG. 7A is formed based on the assumption that the transistor elements have 0.2 ns delay each, the transistor elements are divided into 17 groups in accordance with their total number ranging from 25 to 100, and the variations in the number of the transistor elements are small in the region where the delay is small, and are large in the region where the delay is large, thereby generating the 0 ns to 3 ns correction signals.

As described above, according to the present embodiment 2, even when the semiconductor device operates at a high speed, the redundant delay strings do not appear in the actual delay measurement circuit 5, and when it operates at a low speed, the fine adjustment becomes possible.

FIG. 7B shows the theoretical delay amounts for various numbers of elements according to the lookup table, and FIG. 8 is a graph illustrating them.

Embodiment 3

Figure 9:
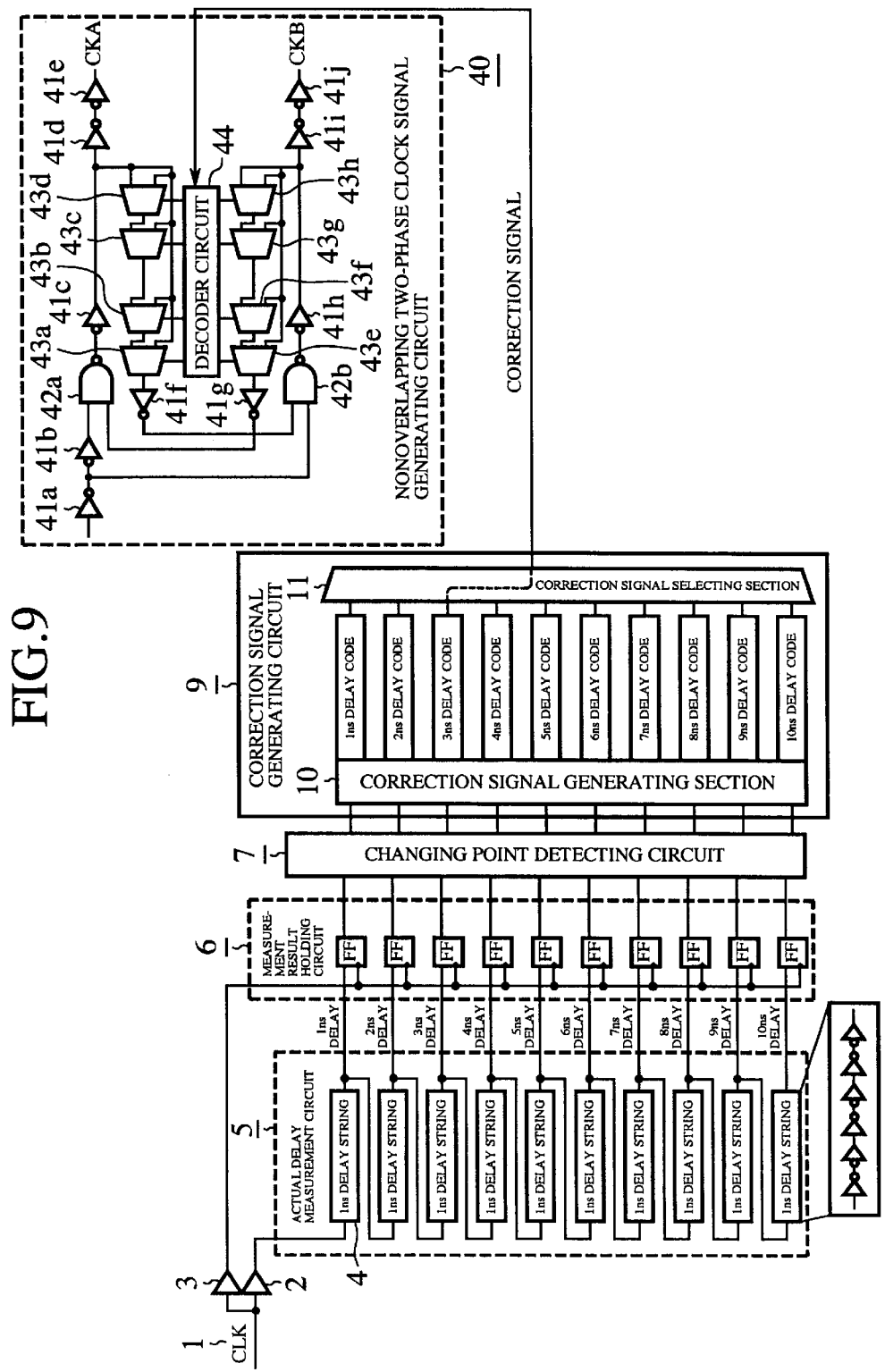
FIG. 9 is a circuit diagram showing a configuration of an embodiment 3 in accordance with the present invention, in which the delay amount adjusting circuit is applied to a nonoverlapping two-phase clock signal generating circuit.

FIG. 9 is a circuit diagram showing a configuration of a nonoverlapping two-phase clock signal generating circuit of an embodiment 3 in accordance with the present invention to which the delay amount adjusting circuit is applied. In FIG. 9, the reference numeral 40 designates a nonoverlapping two-phase clock signal generating circuit (nonoverlapping two-phase clock signal generating means). Reference numerals 41a–41j each designate an inverter; 42a and 42b each designate a NAND circuit; and 43a–43h each designate a selector (delay section). The selectors 43a–43h are provided as feedback delay strings of the nonoverlapping two-phase clock signal generating circuit 40, and their connection numbers are variable. The reference numeral 44 designates a decoder circuit for decoding the correction signal generated by the correction signal generating circuit 9, and switches the selectors 43a–43h. The remaining configuration is the same as that of FIG. 1.

Next, the operation of the present embodiment 3 will be described.

The present embodiment 3 is an example in which the delay amount adjusting circuit of the foregoing embodiment 1 is applied to the nonoverlapping two-phase clock signal generating circuit 40.

In FIG. 9, the selectors 43a–43d and 43e–43h, which are provided as the feedback delay strings of the nonoverlapping two-phase clock signal generating circuit 40, are switched in response to the correction signals output from the decoder circuit 44 that decodes the correction signal supplied from the correction signal generating circuit 9.

Thus, the present embodiment 3 can establish accurate nonoverlapping width independently of the manufacturing variations of the semiconductor device.

Embodiment 4

Figure 10:
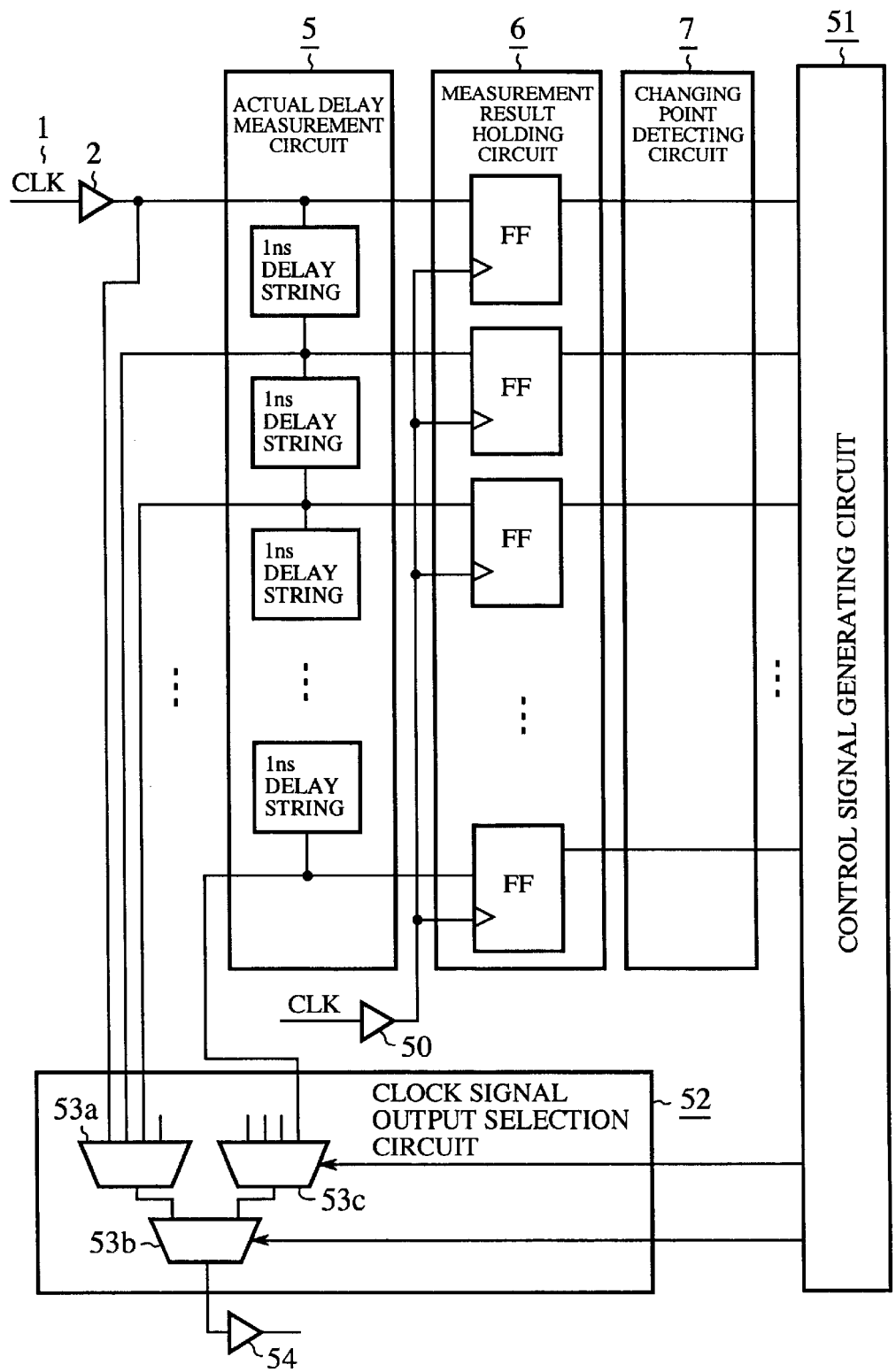
FIG. 10 is a circuit diagram showing a configuration of an embodiment 4 in accordance with the present invention, in which the delay amount adjusting circuit is applied to an inter-two-clock phase adjusting circuit.

FIG. 10 is a circuit diagram showing a configuration of an inter-two-clock phase adjusting circuit of an embodiment 4 in accordance with the present invention, to which the delay amount adjusting circuit is applied. In FIG. 6, the reference numeral 6 designates a measurement result holding circuit (measurement result holding means) including a plurality of flip-flops corresponding to the individual stages of the 1 ns-delay strings 4. Using a clock signal CLK 50 with a period of the equal to or an integer multiple of the period of the clock signal CLK 1, the measurement result holding circuit 6 samples the clock signal, the phases of which are shifted from the phase of the clock signal CLK 1 by amounts corresponding to the individual 1-ns-delay strings 4 of the actual delay measurement circuit 5, at the timing of the clock signal CLK 50, and holds the sampling results as the measurement results.

The reference numeral 51 designates a control signal generating circuit (clock signal output selection means) for generating a control signal for selecting one of the clock signals, the phases of which are shifted by the 1-ns-delay strings 4 of the actual delay measurement circuit 5 in response to the changing point detected by the changing point detecting circuit 7. The reference numeral 52 designates a clock signal output selection circuit (clock signal output selection means) including selectors 53a–53c to select the clock signal whose phase is changed in response to the control signal; and 54 designates a buffer cell. The remaining configuration is the same as that of FIG. 1.

Figure 11:
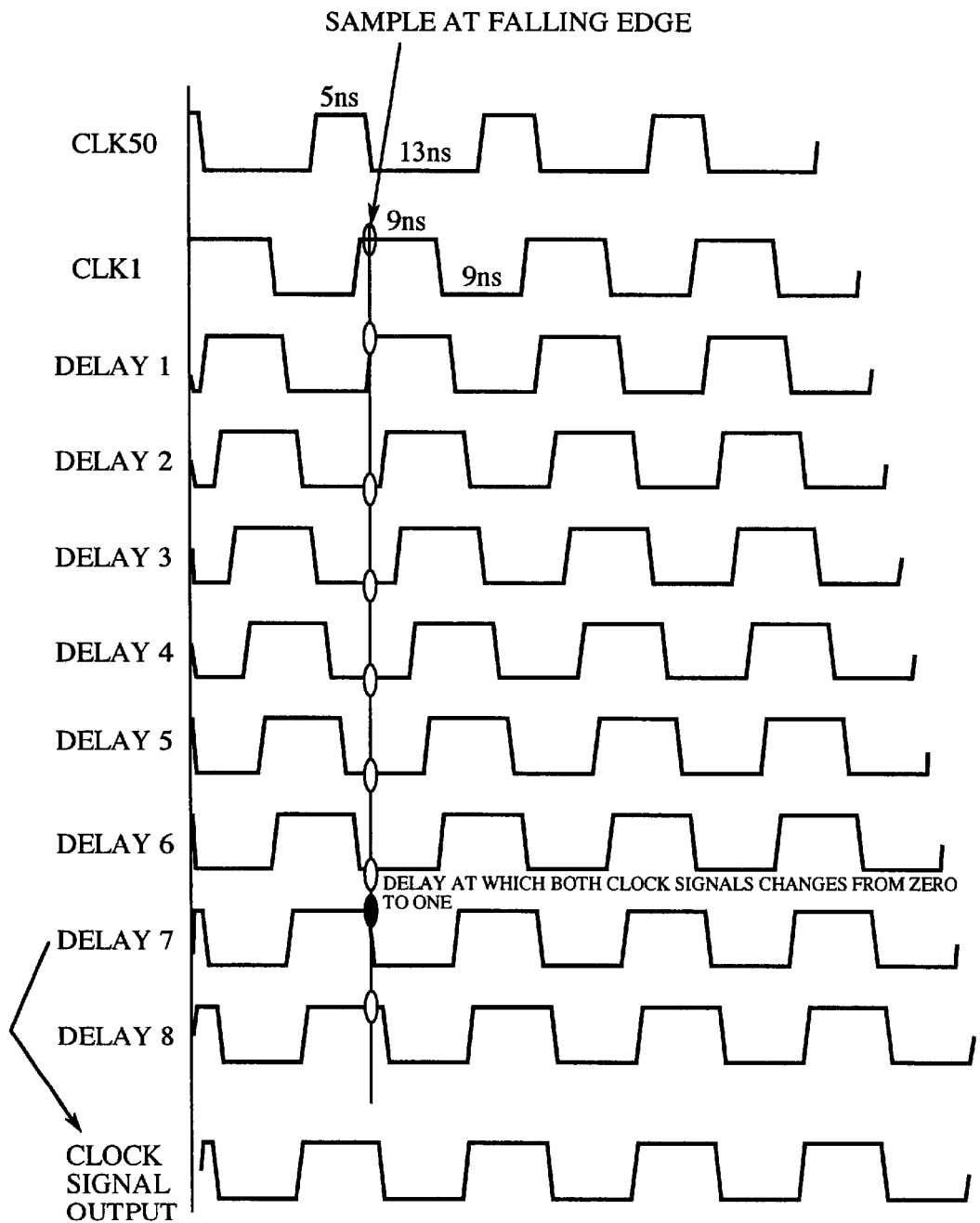
FIG. 11 is a timing chart illustrating the operation of the inter-two-clock phase adjusting circuit of the embodiment 4 in accordance with the present invention.
Figure 13B:
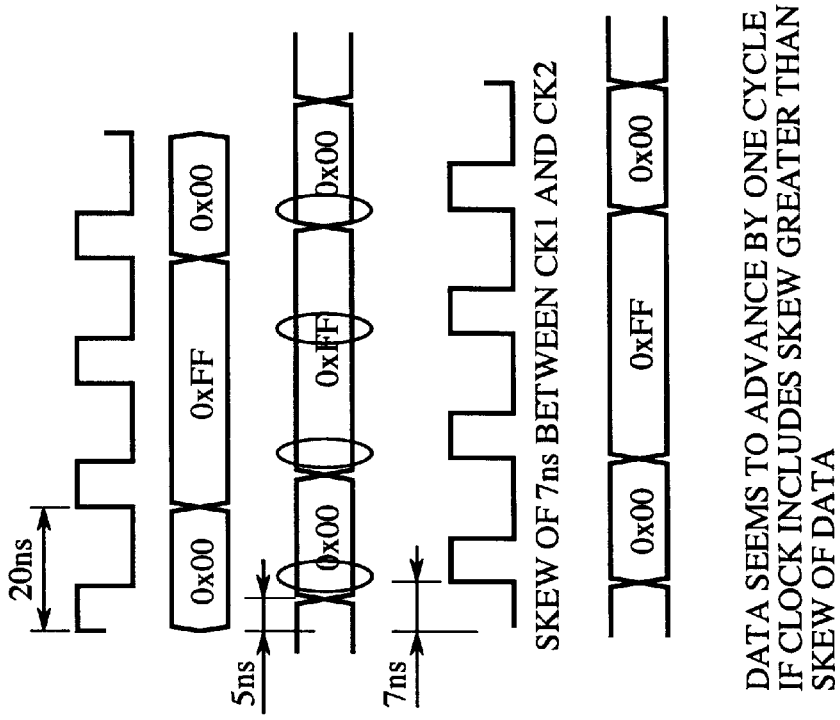
FIG. 13B is a timing chart illustrating a case with a problem of the conventional data transmission between the two flip-flops.
Figure 13A:
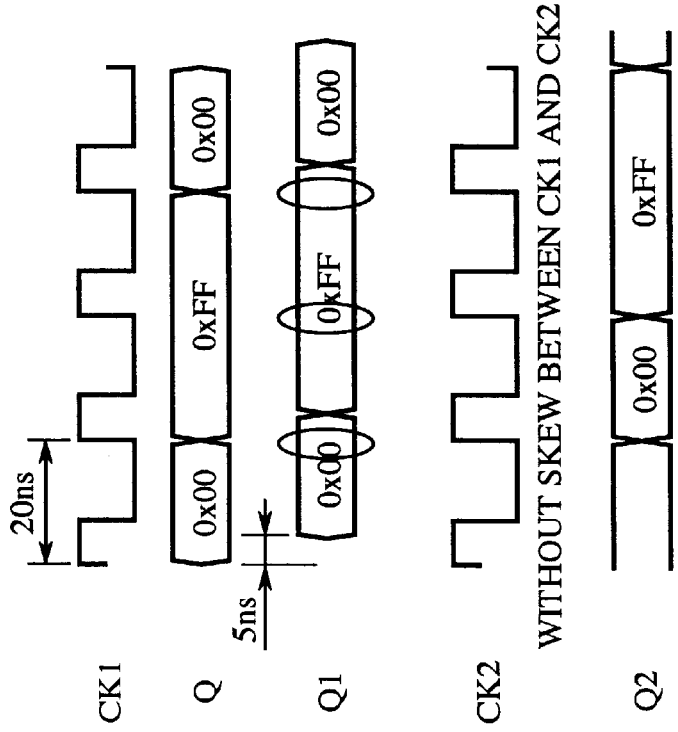
FIG. 13A is a timing chart illustrating a normal mode of the conventional data transmission between the two flip-flops.

Next, the operation of the present embodiment 4 will be described with reference to FIG. 11, a timing chart illustrating the operation of the inter-two-clock phase adjusting circuit of the embodiment 4 in accordance with the present invention.

The present embodiment 4 is an example in which the delay amount adjusting circuit of the foregoing embodiment 1 is applied to the inter-two-clock phase adjusting circuit for carrying out phase adjustment between the clock signal CLK 1 and the clock signal CLK 50 with the period of an integer multiple of the clock signal CLK 1.

In FIG. 10, the measurement result holding circuit 6 samples the clock signal CLK 1 of the actual delay measurement circuit 5, and the clock signal whose phases are shifted from that of the clock signal CLK 1 by amounts corresponding to the individual 1-ns-delay strings 4, at the timing of the falling edge of the clock signal CLK 50 with the same period as that of the clock signal CLK 1 but with a different phase, and holds the measurement results (the timing is indicated by small ellipses). Thus, the measurement result holding circuit 6 holds the measurement results "110000011" for the clock signal CLK 1 and delays 1–8 of FIG. 11.

The changing point detecting circuit 7 detects the changing point from "0" to "1". Since the falling edge of the clock signal CLK 1 is aligned with that of the clock signal CLK 50 at the changing point detected (delay 7), the control signal generating circuit 51 generates the control signal for enabling the delay 7 to be selected as the output. Thus, the selectors 53a–53c of the clock signal output selection circuit 52 are switched in response to the control signal. The clock signal output selection circuit 52 selects the clock signal corresponding to the output of the delay 7 of the actual delay measurement circuit 5 to be output via the buffer cell 54.

As described above, the present embodiment 4 can output the clock signal CLK 1 whose falling edge is aligned with the falling edge of the clock signal CLK 50.

Here, when the measurement result holding circuit 6 samples the data at the timing of the rising edge of the clock signal CLK 50, it can output the clock signal CLK 1 whose rising edge is phase matched to that of the rising edge of the clock signal CLK 50.

What is claimed is:

1. A semiconductor device comprising:

delay amount measuring means for measuring an actual delay amount corresponding to a specified delay amount by supplying a clock signal with a known period to a plurality of delay strings, and by detecting phase variations of the clock signal which are produced through said delay strings, each of which has a delay amount determined in advance;

a plurality of delay sections each including a delay string capable of freely adjusting a connection number of delay elements; and correction signal generating means for generating a correction signal for enabling each of said delay sections to correct the connection number of the delay strings such that each delay section has a desired delay amount in accordance with the actual delay amount that corresponds to the specified delay amount and is measured by said delay amount measuring means.

2. The semiconductor device according to claim 1, wherein said delay amount measuring means comprises:

an actual delay measurement section that includes a plurality of delay strings connected in series, which have a specified delay amount to bring about phase variations of the clock signal with the known period;

measurement result holding means for sampling the clock signals with the phase variations output from the individual delay strings of said actual delay measurement section at timing of a sampling clock signal, and for holding sampled results as measurement results, the sampling clock signal having a same period and phase as the clock signal, or having a same period as the clock signal, or having a period integer multiple of the clock signal; and changing point detecting means for detecting a first changing point of the measurement results beginning from a smallest delay of the measurement results held by said measurement result holding means.

3. The semiconductor device according to claim 2, wherein said actual delay measurement section comprises a plurality of delay strings that have a same specified delay amount and are connected in series.

4. The semiconductor device according to claim 3, wherein said correction signal generating means comprises a table memory for storing a lookup table that records in advance connection numbers of delay elements of said delay sections for providing desired delay amounts to said delay sections, in correspondence to a set of desired delay amounts of said delay sections and to a number of delay elements of said actual delay measurement section, which corresponds to the changing point detected by said changing point detecting means, and wherein said correction signal generating means generates the correction signal in accordance with the connection numbers of the delay strings in said lookup table.

5. The semiconductor device according to claim 2, wherein said changing point detecting means comprises masking means for masking changing points other than the first changing point of the measurement results held by said measurement result holding means.

6. The semiconductor device according to claim 2, wherein said changing point detecting means comprises smoothing means for detecting the changing point considering a currently detected changing point and a previously detected changing point.

7. The semiconductor device according to claim 2, wherein said changing point detecting means comprises changing point fixing means for fixing the changing point detected.

8. The semiconductor device according to claim 2, wherein said plurality of delay strings of said actual delay measurement section have small specified delay amounts in a region where the delay is small, and large specified delay amounts in a region where the delay is large.

9. The semiconductor device according to claim 8, wherein said correction signal generating means comprises a table memory for storing a lookup table that records in advance connection numbers of delay elements of said delay sections for providing desired delay amounts to said delay sections, wherein the connection numbers correspond to a set of desired delay amounts of said delay sections and to a number of delay elements of said actual delay measurement section, which corresponds to the changing point detected by said changing point detecting means, and wherein said correction signal generating means generates the correction signal in accordance with the connection numbers of the delay strings in said lookup table.

10. The semiconductor device according to claim 1, wherein each of said plurality of delay sections comprises:
   a plurality of delay strings, each of which has a same specified delay amount; and
   delay string connecting means interposed between said delay strings for individually switching connection between said delay strings in response to the correction signal.

11. The semiconductor device according to claim 1, wherein each of said plurality of delay sections comprises:
   a plurality of delay strings with specified delay amounts increasing in powers of two; and
   delay string connecting means interposed between said delay strings for individually switching connection between said delay strings in response to the correction signal.

12. The semiconductor device according to claim 1, wherein said correction signal generating means generates the correction signal in accordance with an expression (desired delay amount of the delay section)×(specified delay amount)/(actual delay amount).

13. A semiconductor device comprising:
   delay amount measuring means for measuring an actual delay amount corresponding to a specified delay amount by supplying a clock signal with a known period to a plurality of delay strings, and by detecting phase variations of the clock signal which are produced through said delay strings, each of which has a delay amount determined in advance;
   two delay sections, each of which is provided as a feedback delay string of a nonoverlapping two-phase clock signal generating circuit, and is capable of freely adjusting a connection number of delay elements; and
   correction signal generating means for generating a correction signal for enabling each of said delay sections to correct the connection number of the delay strings such that each delay section has a desired delay amount in accordance with the actual delay amount that corresponds to the specified delay amount and is measured by said delay amount measuring means.

14. A semiconductor device comprising:
   an actual delay measurement section that includes a plurality of delay strings connected in series, which have a specified delay amount to bring about phase variations of a clock signal with the known period;
   measurement result holding means for sampling clock signals with the phase variations output from the individual delay strings of said actual delay measurement section at timing of a sampling clock signal, and for holding sampled results as measurement results, the sampling clock signal having a same period and phase as the input clock signal, or having a same period as the clock signal, or having a period integer multiple of the clock signal;
   changing point detecting means for detecting a first changing point of the measurement results beginning from a smallest delay of the measurement results held by said measurement result holding means; and
   clock signal output selection means for selecting and outputting one of the clock signals with the phase variations output from said delay strings of said actual delay measurement section in response to the changing point detected by said changing point detecting means.

* * * * *